US009513112B1

(12) United States Patent
Rush et al.

(10) Patent No.: US 9,513,112 B1
(45) Date of Patent: Dec. 6, 2016

(54) THREE DIMENSIONAL CHARACTERIZATION OF SILICON WAFER VIAS FROM COMBINED ON-TOP MICROSCOPIC AND BOTTOM-THROUGH LASER FRINGES MEASUREMENT

(71) Applicant: n&k Technology Inc., San Jose, CA (US)

(72) Inventors: Christopher Rush, Forestvilee, CA (US); John C. Lam, Brentwood, CA (US)

(73) Assignee: n&k Technology, Inc., San Jose, CA (US)

( * ) Notice: Subject to any disclaimer, the term of this patent is extended or adjusted under 35 U.S.C. 154(b) by 63 days.

(21) Appl. No.: 14/466,936

(22) Filed: Aug. 22, 2014

(51) Int. Cl.
*G01B 9/02* (2006.01)
*G01B 11/24* (2006.01)
(52) U.S. Cl.
CPC ................ *G01B 11/2441* (2013.01)
(58) Field of Classification Search
CPC ..... G01B 11/2441; G01B 11/22; G01B 11/24; G01B 11/254; G06T 7/0057; G01N 21/9501; G01N 21/9505; G01N 21/956

USPC .................... 356/495, 503, 511, 512, 237.4, 237.5,356/603–605
See application file for complete search history.

(56) References Cited

U.S. PATENT DOCUMENTS

2012/0127473 A1\* 5/2012 Pfaff .................. G01B 11/2441
356/457

OTHER PUBLICATIONS

Weng Hong Teh, Backside Infrared Interferometric Patterned Wafer Thickness Sensing for Through-Silicon-Via (TSV) Etch Metrology, IEEE Transactions on Semiconductor Manufacturi.

\* cited by examiner

*Primary Examiner* — Tarifur Chowdhury
*Assistant Examiner* — Jonathon Cook
(74) *Attorney, Agent, or Firm* — Lumen Patent Firm

(57) ABSTRACT

A collimated laser beam is directed towards the wafer bottom such that the impinging light is partially forward deflected along the vias' bottom edges. Concentric laser interference fringes occur on the wafer top from constructive and destructive interference between the forward deflected and directly through propagating laser. A top down optical image from a number of vias' top openings and a top down fringe image from the same vias' concentric fringe sets are processed to three dimensionally characterize the vias.

18 Claims, 5 Drawing Sheets

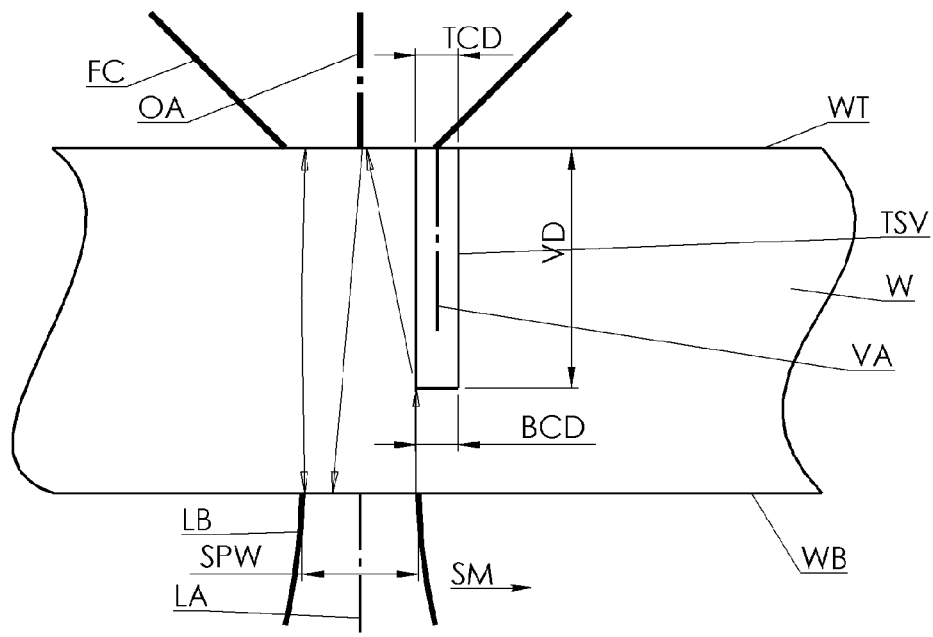
Prior Art Fig. 1A
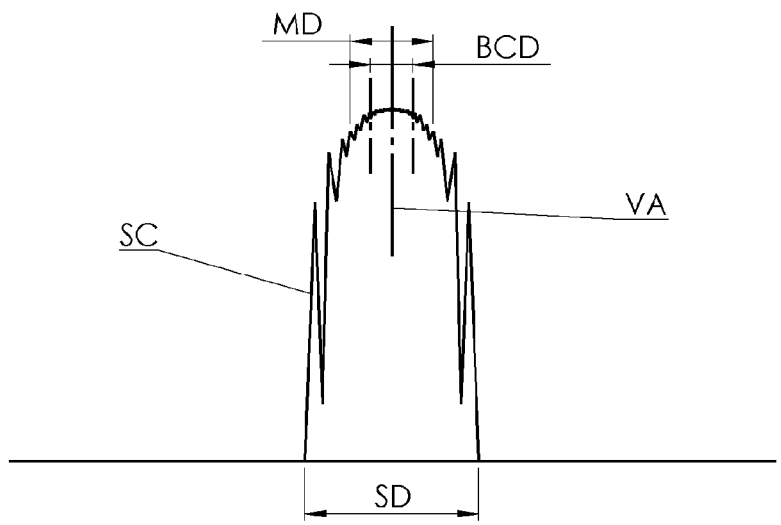
Prior Art Fig. 1B

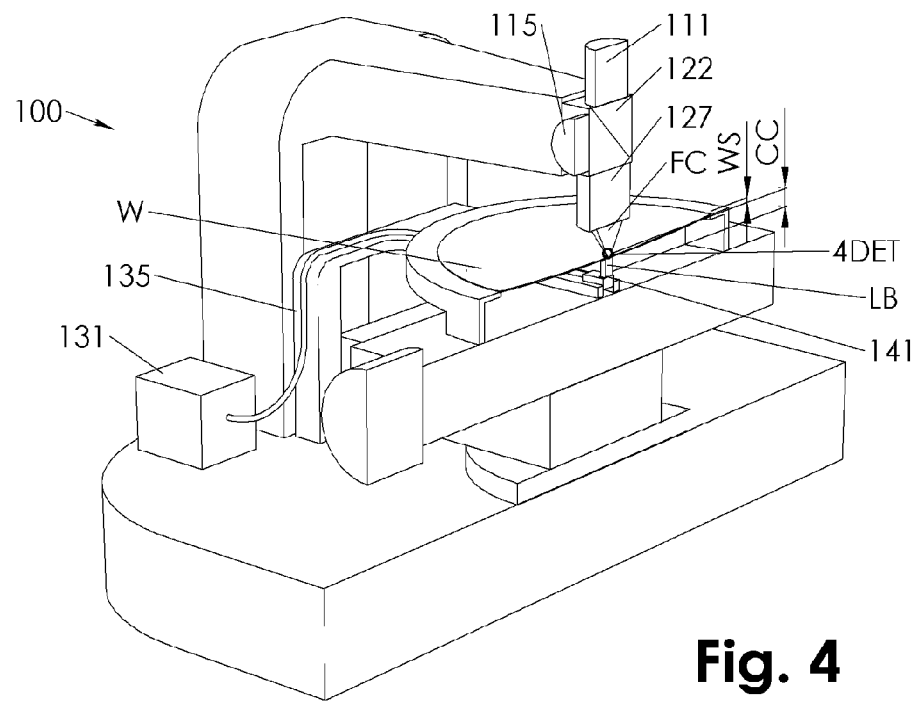
Fig. 4
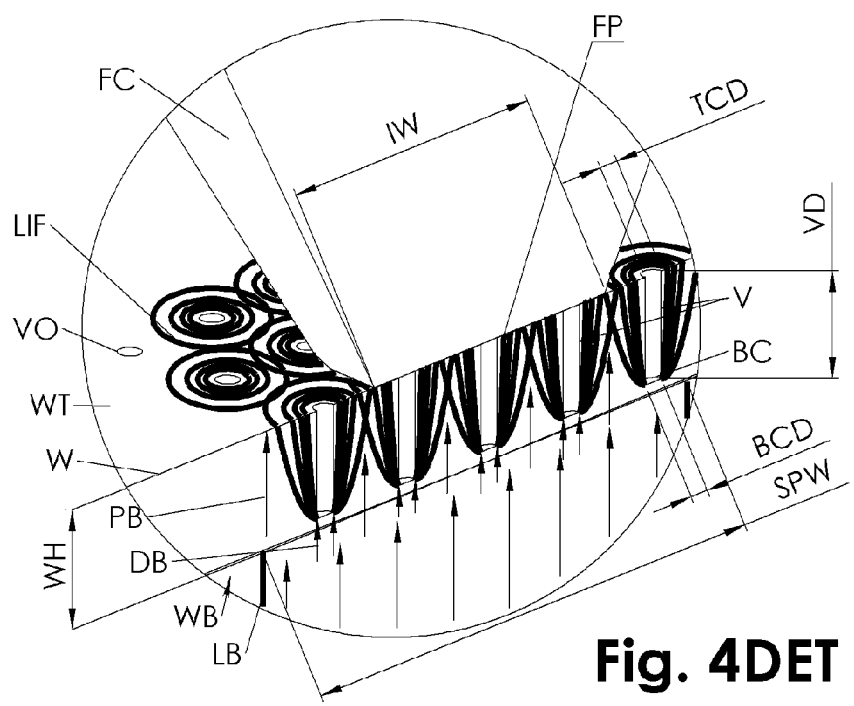
Fig. 4DET

THREE DIMENSIONAL CHARACTERIZATION OF SILICON WAFER VIAS FROM COMBINED ON-TOP MICROSCOPIC AND BOTTOM-THROUGH LASER FRINGES MEASUREMENT

FIELD OF INVENTION

The present invention relates to metrology techniques for measurement of geometrical parameters of Through Silicon Vias. In particular, the present invention relates to metrology techniques based on laser interference effects within the silicon wafer.

BACKGROUND OF INVENTION

Ever advancing designs of integrated circuits increasingly rely on stacked silicon wafer architectures whereby conductive vertical connections across the individual wafers are essential for connecting their respective circuitries. These vertical connections are made by initially fabricating blind holes into one side of the silicon wafer. The blind holes are filled with conductive material before the wafer is thinned down on the opposite side such that the vertical conductor extends all the way between top and bottom side of the wafer. These well known Through Silicon Vias (TSV) are becoming increasingly thin in cross section, are increasingly dense arrayed and may utilize non round cross sections such as squares.

A Prior Art infrared interferometric wafer thickness sensor (WTS) is employed for measuring some of the essential geometric parameters of TSV as is depicted in Prior Art FIGS. 1A and 1B. Thereby, the silicon's transparency for infrared light is utilized to scan across the wafer height WH with a focused infrared laser beam and capture its back reflections by the same lens system that focused the laser beam LB with respect to the optical axis LA. The back reflections are interpreted to derive a scan contour SC as the focused laser beam LB is moved in scan direction SM over the TSV. During this prior art scanning process, the optical axis LA needs to be moved relative to the wafer W. Due to the bulkiness of the WTS lens system and its needs for closest proximity to the wafer bottom, an extensive peripherally positioned x-y stage system needs to be employed to provide sufficient clearance immediately beneath the wafer W across its bottom. Such peripherally positioned x-y stage system may introduce additional challenges for precise positioning and motion. In addition, such prior art WTS may preclude the positioning any well known structures for lifting and/or lowering the wafer W from and onto the wafer W fixture. Therefore, there exists a need for TSV measurement system that is sufficiently compact especially beneath the wafer W so as to not interfere with a standard compact x-y stage, the wafer W fixture and eventual additional well known structures for raising and lowering the wafer W off and onto the wafer W fixture. The present invention addresses this need.

A minimum spot width SPW of the Prior Art is limited by laser wavelength, which in turn is limited to the range at which the wafer W material is translucent as is well known in the art. At the time of this invention, the minimum spot width SPW is about 5 um for silicon wafer W. The scanning system's resolution on one hand needs a spot width SPW that is as small as possible for maximum scanning sharpness. But on the other hand, the smaller the spot width SPW the more scanning passes need to be performed for a given wafer measurement area. Also, scanning systems require precise mechanical motion for lateral measurement accuracy. Nevertheless, even precision X-Y motion stages provide only accuracy of down to about 4 um at the time of this invention, which is insufficient for TSV TCD in the single digit um range. Therefore, there exists a need for a metrology system and method that is not limited by focused laser spot width SPW and not limited by the accuracy of a mechanical motion system. The present invention addresses also this need.

Silicon has a fairly high index of refraction such that the laser entering the waver bottom WB is aligned closer to parallel. The moment it impinges on the TSV bottom VB, a portion is back reflected with phase change. Nevertheless, another portion of the laser impinging on the TSV bottom VB is forward deflected also with a phase change along the edge of the TSV bottom VB. Hence at the wafer top WT, directly entered laser and once deflected and phase changed laser impinge and are back reflected. The interaction between the oppositely phased lasers results in illumination intensity fringes that distort the measurement and scanning contour SC along the scanning distance SD as shown in Prior Art FIG. 1B. This is a key limiting issue in Prior Art back reflective laser interference metrology. Moreover, lateral fringe distortions become more dominant as TSV diameter TCD decreases and TSV aspect ratio (AR) increase. At the time of this invention, TSV depth VD with AR of only less than 15 at diameter TCD of 5 um and below are measurable with such Prior Art metrology technology. As TSV top diameters TCD are ever decreasing below 5 um, AR increases substantially above 15. For example and as is documented in the literature, the scan distance SD of an isolated TSV with 1 um TCD and AR of about 14 is about seven times CD and representative measurement width MD along that scan distance SD is about four times CD. Therefore, there exists a need for a metrology system and technology that is not adversely affected by interference fringes and that is capable of measuring AR substantially above 15 for TSV top diameters CD below 5 um. The present invention addresses this need.

As TSV AR increases, fabrication of the TSV with consistent cross section along its entire depth VD becomes increasingly challenging and needs to be more closely monitored. To fully three dimensionally characterize a TSV, location, shape and dimensions of both top diameter CD and bottom diameter BCD need to be independently measured and characterized. The TSV top diameter CD is simply accessible by well known microscopic on-top imaging and measurement techniques. Nevertheless, and in order to obtain sufficiently precise information about position of via top opening TCD and via bottom BCD, the optical axis OA of the separate top down microscopic measurement system needs to by precisely aligned with the WTS axis LA at all times. This axes OA, LA alignment is challenging to be maintained during the scanning operation where the x-y stage during rapid scan movements may introduce mass forces on the entire system structure. Therefore, there exists a need for metrology system that does not require alignment between top down optical axis OA and any bottom up laser light. The present invention addresses also this need.

Prior Art WTS requires the laser system to reach within a few microns of the wafer bottom WB. Nevertheless, with ever increasing wafer diameter and ever decreasing wafer thickness, wafer sagging becomes more and more of an issue. For example, a 300 mm diameter silicon wafer W with a common thickness of about 1 mm, sags about 200 um. This requires substantial refocusing of the bottom up laser during prior art WTS scanning. In addition, the laser focusing optics is typical several dozens of mm in diameter. This, in conjunction with the need for a small distance to the wafer bottom WB, limits wafer W periphery access to avoid collision of the laser focusing optics with the wafer fixture. Therefore, there exists a need for a TSV metrology system and method that provides for sufficient clearance to the wafer bottom such that it is unimpeded by wafer sagging and wafer fixtures. The present invention addresses also this need.

SUMMARY

A laser interference based TSV characterization system utilizes interference fringes occurring from interference between laser of same wavelength and originally same phase that propagates directly through the wafer thickness and that is forward deflected along the edge of the TSV bottom. The laser interference fringes produce concentric contours of alternately increased and decreased illumination intensities on the wafer side that is opposite to the laser impinging side. The laser is produced from a well known laser source and is preferably transmitted via an optical fiber to a beam collimator placed beneath the wafer and beneath an optical lens system above the wafer. The phase aligned laser light exits the beam collimator and impinges the wafer bottom. A portion of it propagates directly towards the wafer top. Another portion impinges on the TSV bottom and exits into the TSV. An additional portion is forward deflected along the edge of the TSV bottom and continues to propagate in a deflection angle and with phase change also towards the wafer top thereby producing the intensity fringes in conjunction with the directly and phase unchanged laser light the scientific principles of which are well known in the art. The concentric interference fringes occur on the wafer top and are captured by the optical lens system and an image sensor. Concentric fringe sets of a number of TSV are simultaneously captured in the fringe image. The concentric fringe sets are compared with an optical image previously taken at the same wafer top location. That way, the center of the TSV top derived from the optical image is compared with fringe templates to derive information about TSV bottom center, diameter and TSV edge depth. In conjunction with the diameter of the TSV top that is derived from the optical image, the TSV are three dimensionally characterized.

The compact beam collimator and the optical fiber are conveniently integrated within wafer fixture and compact x-y stage leaving sufficient room for pin lifters and the like to raise and lower the wafer from and onto the wafer fixture. Because of the parallel exiting laser, the beam collimator may be positioned with sufficient vertical clearance below the wafer and the wafer fixture to circumvent any interference with the wafer fixture and an eventually sagging wafer. Fringe image and optical top image may be taken in immediate succession and without any x-y stage movement in between. As a result, the TSV measurement is unaffected by mechanical tolerances of the x-y stage. A multitude of TSV may be simultaneously imaged and analyzed, thereby greatly reducing x-y stage movements for a given area of the wafer to be examined and measured.

BRIEF DESCRIPTION OF THE FIGURES

Prior Art FIG. 1A is a schematic cross section of a Prior Art back reflective laser interference metrology measurement of a via in a wafer.

Prior Art FIG. 1B is a simplified measurement example taken with the measurement depicted in Prior Art FIG. 1A.

FIG. 4 is a perspective cut view of the simplified laser interference based TSV characterization system of FIG. 2 with wafer.

FIG. 4DET is a detailed perspective cut view as indicated in FIG. 4.

DETAILED DESCRIPTION

Figure 2:
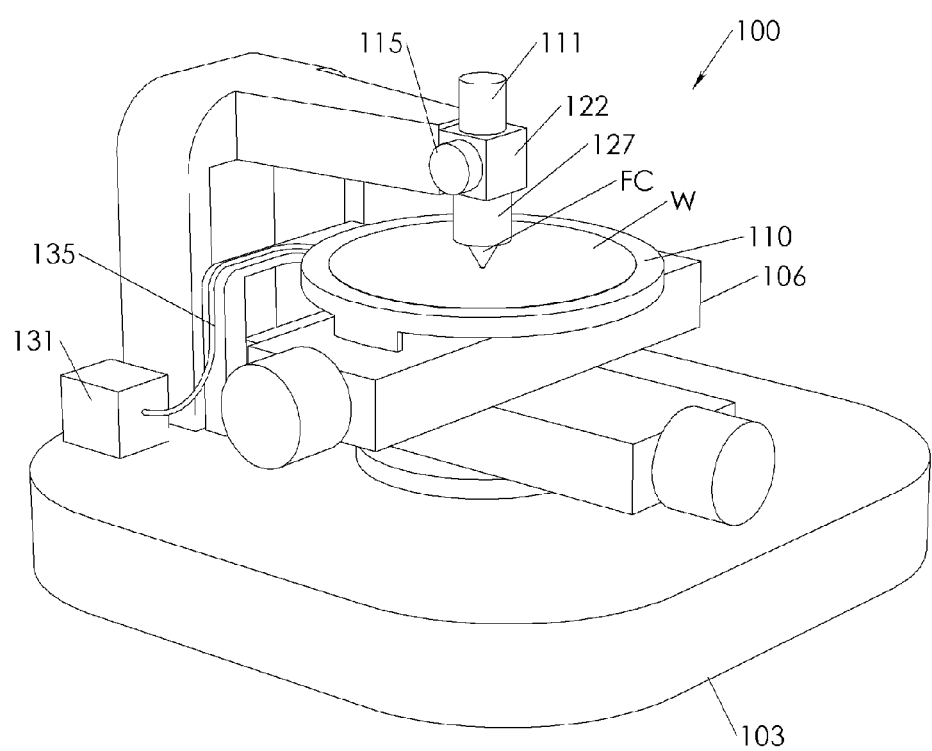
FIG. 2 is a perspective view of a simplified laser interference based TSV characterization system of the present invention including a wafer.
Figure 3:
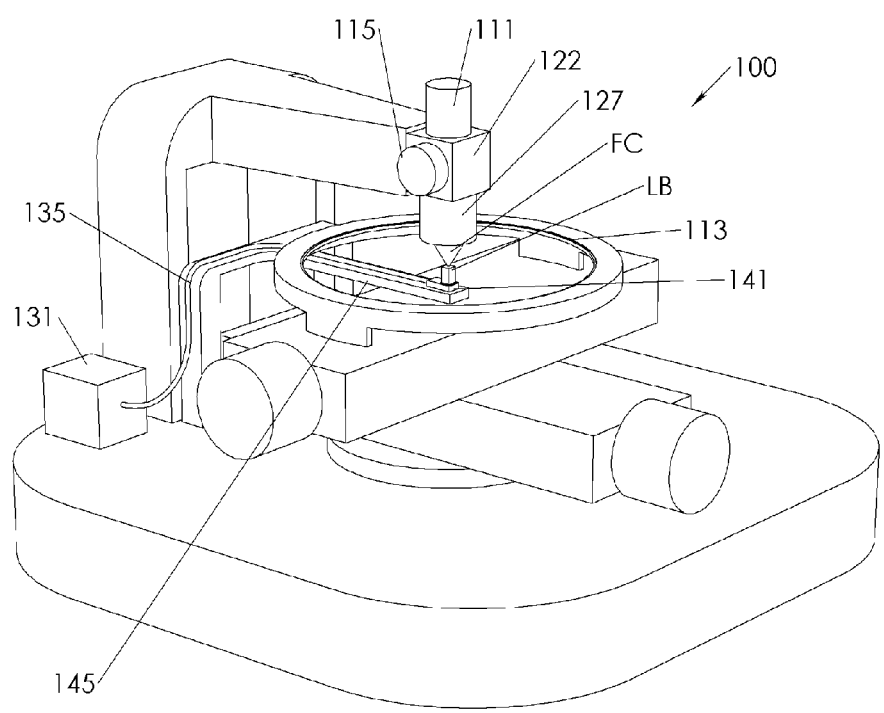
FIG. 3 is the perspective view of the simplified laser interference based TSV characterization system of FIG. 2 without wafer.

Referring to FIG. 2-4, a laser interference based three dimensional through silicon via characterization system 100 features a base 103, an x-y stage 106 fixed with respect to the base 103 and a wafer fixture 110 mounted on the x-y stage 106. The wafer fixture 110 may be configured for holding a silicon wafer W. Further part of the system 100 are a laser source 131, a lens system 127, a beam collimator 141, a light source 115, an image capture unit 111 and an image processing unit 151 depicted in FIG. 5. The laser source 131 may be a commercially available laser diode providing a laser light at a first wavelength of preferably 1064 nm at which the silicon wafer W is transparent. At this wavelength, the laser light passes through silicon with minimal attenuation and is also detectable by commercially available CCD sensors. The lens system 127 is fixed with respect to the base 103 above the wafer fixture 110. The lens system 127 has a focal cone FC and provides a focal plane FP within a wafer height WH minus eventual wafer sagging WS above the wafer fixture bottom 113. The beam collimator 141 is positioned in between the wafer fixture 110 and the x-y stage 106 and is preferably fixed with respect to the base 103. The beam collimator 141 receives the laser light from the laser source 131 preferably via an optical fiber 135 that may be conveniently fitted within and/or around the structure holding the beam collimator 141. Such a structure may be a collimator carrier arm 145, which does not require substantial additional clearance between the x-y stage 106 and the wafer fixture 110. The beam collimator 141 receives the laser light and redirects the emitting laser light LB upward towards the lens system 127 across the wafer fixture 110.

A vertical clearance CC between the beam collimator 141 and the fixture bottom 113 may be at least 10 mm and preferably ½ inch. Prerequisite for such favorable large vertical clearance CC is the parallel laser propagation provided by the beam collimator 141. The vertical clearance CC contributes substantially to integrate the beam collimator 141 within common x-y stage 106 and wafer fixture 110 configurations. Due to the light weight and compactness of the beam collimator 141 and consequently lean carrier arm 145, the beam collimator 141 is conveniently fitted in between the wafer fixture 110 and the x-y stage 106 to access the wafer W for measurement irrespective of a repositioning of the x-y stage 106.

Figure 5:
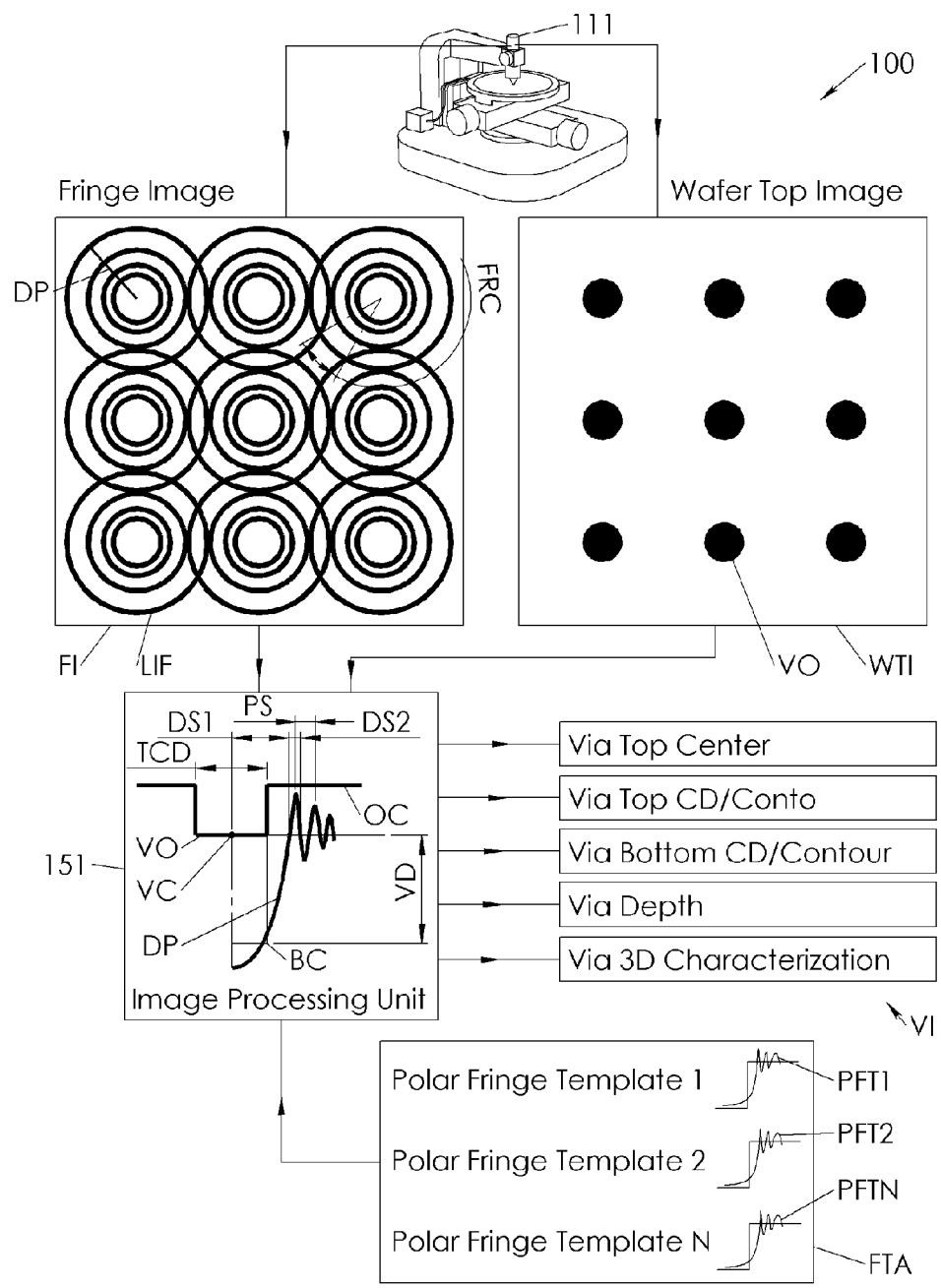
FIG. 5 is a process schematic of the laser interference based TSV characterization system of the present invention.

The light source 115 is connected to the lens system 127 across a beam splitter 122 and provides a second light within the focal plane FP at a second wavelength at which the silicon wafer W is opaque. Second wavelength includes in context with the present invention also a wavelength range such as that of a common white light employed in optical microscopy. The image capture unit 111 may include a commercially available CCD sensor. The image capture unit 111 is also connected to the lens system 127 across the beam splitter 122. The image capture unit 111 is configured for capturing a wafer top image WTI as shown in FIG. 5 including a number of via openings VO while illuminated by the second light 115. In addition, the image capture unit 111 is configured for capturing an interference fringes image FI containing laser interference fringes LIF concentrically occurring around the via openings on the wafer top WT and within the focal plane FP as shown in FIG. 4DET. The spot width SPW of the impinging laser LB may be above 1 mm and the imaging width IW of the focal cone FC is at least about 200 um resulting of a field of view of at least 120 um by 120 um for simultaneous via measurement.

The laser interference fringes LIF occur as a result of a constructive and destructive interference between a first portion PB and second portion DB of the bottom up impinging laser light LB. The first laser portion PB is directly propagating through the silicon wafer W and the second laser portion DB is forward deflected and phase changed along a bottom contour BC of the via V. Parabolic diffraction patterns occur along the via depth VD in the immediate surrounding of the via V. The parabolic diffraction patterns terminate in the form of concentric illumination spikes and troughs that decrease in contrast and offset to each other in direction away from the via opening VO on the wafer W side that is opposite the side of laser light LB impinging. Due to the parabolic propagation of the diffraction patterns, contrast and/or offset and their decrease between adjacent fringes may be correlated to the depth and radius of the corresponding via bottom contour BC. The image processing unit 151 utilizes this parabolic propagation correlation. It processes the wafer top image WTI to obtain the top diameter TCD and the coordinates of their respective centers VC as shown in FIG. 5. The image processing unit 151 processes the interference fringe image FI in accordance with the parabolic propagation correlation to derive information about at least shape and depth VD of the bottom contour BC. From comparing the derived top diameter TCD, top center VC, bottom contour BC and bottom depth VD, the via V may be then three dimensionally characterized. Through three dimensional characterization, deteriorating cross sections from deep trench etching may be identified. This may be of particular advantage in case of non round via cross sections such as square cross sections that may have a tendency with increasing aspect ratio to become downwards more round. Continuous cross section is crucial to maintain consistent conductivity across the height of the final conductor filled into the via V as is well known in the art.

Part of the system 100 may be a polar fringe template array FTA containing a number of polar fringe templates PFT1-PFTN as shown in FIG. 5. The polar fringe template array FTA corresponds to a predetermined array of depths and center radii of the TSV bottom contour. The image processing unit 151 may derive shape and depth information of the via V by comparing polar data profiles DP of single interference fringe sets around a single via V with the polar fringe template array FTA. The data profile DP from the captured fringe image FI and the profile fringe templates PFT1-PFTN may be generated by plotting illumination intensities along a radial line passing through the center of the respective feature. The previously derived via center VC coordinates of the via opening VO may serve as the center and starting point for the data profile DP. The polar fringe templates PFT1-PFTN may be computationally generated using well known theoretical diffraction principles and/or may be captured from physical template structures.

In an iterative procedure, each data profile DP is compared with the polar fringe templates PFT1-PFTN until the goodness of fit of the two profiles is maximized or at a predetermined level. The image processing unit 151 may utilize for its data-template profile comparison the first illumination peak separation PS in direction away from the respective via V to obtain via bottom diameter BCD, and the spacing of the first dark and bright fringes DS1, DS2 in direction away from the respective via V to obtain the via depth VD. The polar data profiles DP are particularly useful in cases of tightly arrayed via V where a high degree of overlap of the interference fringes LIF may occur. There, a data profile DP may be still derived within an angular fringe clearance range FRC. Further more, a number of polar data profiles DP may be produced for each interference fringe set to derive not only the bottom contour diameter BCD, but also an angularly resolved information of the bottom contour BC shape. This may be of particular advantage to three dimensionally characterize via V with non round cross sections such as squares. In an alternate approach and instead of a polar data profile DP as taught above, an averaged data profile DP may be composed of equidistant intensity averages of individual interference fringes LIF.

To three dimensionally characterize a number of via V on wafer W, the wafer W may be placed on the wafer fixture 110. The lens system 127 may feature interchangeable objectives with low and high magnification. The low magnification objective may have a magnification of 10$x$ and may be initially selected for navigation and pattern recognition during which the wafer W is moved by the x-y stage 106 while the beam collimator 141 remains unmoved beneath the lens system 127 and the wafer W. Once a pattern and measurement area is identified, a high magnification objective with a magnification of preferably 100× may be inserted in the lens system 127. Precise positioning of the wafer W with respect to the lens system 127 by use of the high magnification objective may be optional but may not be required. Since wafer top image WTI and fringe image FI are taken while the x-y stage 106 stands still, a precise determination of via center VC coordinates may be provided from the wafer top image WTI by the processing unit 151. This may substantially increase measurement throughput, since mechanical precision positioning must be performed at very low speeds as is well known in the art.

Once the x-y stage 106 has placed the wafer W under the lens system 127 at a desired position and the focal plane FP is coincided with the wafer top WT, a wafer top image WTI is captured while the second light 115 illuminates the wafer top WT and a fringe image FI is captured while the laser light LB impinges the wafer bottom WB. The processing unit 151 then processes the wafer top image WTI for illumination contrasts OC to derive the center coordinates VC and top diameter TCD from via openings VO. That way any contour shape of the via opening VO may be measured as is well known in the art. The obtained via center coordinates VC are then employed by the image processing unit 151 as central starting points for generating polar data profiles DP from any desired interference fringe set in the fringe image FI. Alternately, illumination intensities equidistant to the respective center coordinates VC may be utilized to generate an averaged data profile DP. Next, the spacing of the first dark and bright fringes DS1, DS2 may be compared with the polar fringe templates PFT1-PFTN to obtain the best match. From the best matching polar fringe template PFT1-PFTN, the via depth VD may be derived.

The first fringe peaks spacing PS in turn is compared with the polar fringe templates PFT1-PFTN to obtain again a best match from which radius from center VC may be derived. A number of angularly spaced data profiles DP may be produced from a single interference fringe set around a single via V to obtain an angularly resolved detailed contour information about depth and/or center radii of the bottom contour BC.

The information derived from the wafer top image WTI about via opening VO diameter TCD and/or contour shape may be combined by the processing unit 151 with the information derived from the Fringe Image FI about via bottom contour BC depth, diameter and/or contour shape. That way, the via V may be three dimensionally characterized.

In the preferred case taught in the above of the laser light LB impinging at the wafer bottom WB that is opposite the via openings VO, the concentric interference fringe sets occur on the wafer top WT around the via openings VO. Nevertheless, the present invention may not be limited to a specific impinging direction of the laser light LB with respect to the via opening VO, nor may it be limited to measuring empty via V only. The system 100 may be also be applicable for measuring via V filled with conductive material. Moreover the system 100 and method of the present invention may be utilized to three dimensionally characterize not only a via bottom contour BC as taught above but any deflection contour of a structure embedded not only in a silicon wafer W but in any solid medium that is transparent at some laser light wavelength. A deflection contour in the context of the present invention may be a contour within a solid medium that forward deflects and phase changes an impinging laser light propagating through said solid medium as taught above in context with the via bottom contour BC.

Accordingly, the scope of the present invention described in the Figures and Specification above, is set forth by the following claims and their legal equivalent:

What is claimed is:

1. A laser interference based three dimensional structure in solid medium characterization system comprising:
   a. a laser source that is providing a laser light of a first wavelength at which said medium is transparent;
   b. a beam director positioned at a first side of said medium and directing said laser light towards said first side and said structure;
   c. an image capture unit comprising a focal plane at a second side of said medium that is opposite said first side, said image capture unit being configured for capturing an interference fringes image comprising laser interference fringes from a first portion of said laser light that is directly propagating through said medium and from a second portion of said laser light that is forward deflected and phase changed by a deflection contour of said structure within said medium;
   d. an image processing unit that is computerized processing said interference fringes image to derive a deflection contour shape information and a deflection contour depth information of said deflection contour;
   e. an on to illumination that is illuminating said second side with a secondary light within a second wavelength at which said medium is opaque; and
   wherein said image capture unit being further configured for capturing an optical to image of said structure that is illuminated by said on top illumination on said second side, and wherein said image processing unit three dimensionally characterizes said structure by processing said optical top image in conjunction with said interference fringes image.

2. The laser interference based three dimensional structure in solid medium characterization system of claim 1, further comprising a polar fringe template array that is corresponding to a predetermined array of depths and center radii of said cavity bottom contour, and wherein said image processing unit is deriving at least one of said deflection contour shape information and said deflection contour depth information by comparing said interference fringes image with said polar fringe template array.

3. The laser interference based three dimensional structure in solid medium characterization system of claim 2, wherein said image processing unit derives said deflection contour depth information from comparing of said polar data profile a first dark and bright fringe spacing in direction away from said via with said polar fringe template array.

4. The laser interference based three dimensional structure in solid medium characterization system of claim 2, wherein said image processing unit derives said deflection contour shape information from comparing of said polar data profile a first polar fringe peaks spacing in direction away from said via with said polar fringe template array.

5. The laser interference based three dimensional structure in solid medium characterization system of claim 2, wherein said image processing unit is deriving at least one of said deflection contour shape information and said deflection contour depth information by comparing an equidistant intensity average of said interference fringes image with said polar fringe template array.

6. The laser interference based three dimensional structure in solid medium characterization system of claim 2, wherein a polar fringe template of said polar fringe template array is computationally generated using theoretical diffraction principles.

7. The laser interference based three dimensional structure in solid medium characterization system of claim 2, wherein a polar fringe template of said polar fringe template array is captured from a physical template structure.

8. The laser interference based three dimensional structure in solid medium characterization system of claim 1, wherein said medium is a silicon wafer and said structure is a through silicon via.

9. The laser interference based three dimensional structure in solid medium characterization system of claim 1, wherein said beam director is a beam collimator.

10. The laser interference based three dimensional structure in solid medium characterization system of claim 9, wherein said beam collimator is at least 10 mm spaced apart from said first side.

11. The laser interference based three dimensional structure in solid medium characterization system of claim 9, further comprising an optical fiber that is transferring said laser light from said laser source to said beam collimator.

12. A laser interference based three dimensional through silicon via characterization system comprising:
   a. a base;
   b. an x-y stage fixed with respect to said base;
   c. a wafer fixture for holding a silicon wafer, said wafer fixture being mounted on said x-y stage and comprising a wafer fixture bottom;
   d. a laser source providing a laser light at a first wavelength at which said silicon wafer is transparent;

e. a lens system that is fixed with respect to said base above said wafer fixture, said lens system comprising a focal plane within a wafer height above said wafer fixture bottom;

f. a beam collimator that is positioned in between said wafer fixture and said x-y stage, said beam collimator being fixed with respect to said base such that said laser light received from said laser source is directed upward towards said lens system across said wafer fixture irrespective of a repositioning of said x-y stage;

g. a light source that is connected to said lens system and that is providing a second light within said focal plane at a second wavelength at which said silicon wafer is opaque;

h. an image capture unit that is connected to said lens system and being configured for capturing a wafer top image illuminated by said second light and an interference fringes image comprising laser interference fringes from a first portion of said laser light that is directly propagating through said silicon wafer and from a second portion of said laser light that is forward deflected along a bottom contour of said cavity, wherein said laser interference fringes are about concentric around said cavity; and i. an image processing unit for processing said wafer top image to derive at least a via top diameter and via top center, for processing said interference fringes image to derive at least a via bottom contour shape information and a via bottom contour depth information of said through silicon via, and for three dimensionally characterizing said through silicon via by comparing said via top diameter and said via top center with said via bottom contour shape information and said via bottom contour depth information.

13. The laser interference based three dimensional through silicon via characterization system of claim 12, further comprising a polar fringe template array that is corresponding to a predetermined array of depths and center radii of said via bottom contour, and wherein said image processing unit is deriving at least one of said via bottom contour shape information and said via bottom contour depth information by comparing a polar date profile of said interference fringes image with said polar fringe template array.

14. The laser interference based three dimensional through silicon via characterization system of claim 13, wherein said image processing unit derives said via bottom contour depth information from comparing of said polar data profile a first dark and bright fringe spacing in direction away from said via with said polar fringe template array.

15. The laser interference based three dimensional through silicon via characterization system of claim 13, wherein said image processing unit derives said via bottom contour shape information from comparing of said polar data profile a first polar fringe peaks spacing in direction away from said via with said polar fringe template array.

16. The laser interference based three dimensional through silicon via characterization system of claim 13, wherein said image processing unit is deriving at least one of said via bottom contour shape information and said via bottom contour depth information by comparing an equidistant intensity average of said interference fringes image with said polar fringe template array.

17. The laser interference based three dimensional through silicon via characterization system of claim 12, further comprising a beam clearance between said beam collimator and a wafer fixture bottom, said beam clearance being at least 10 mm.

18. The laser interference based three dimensional through silicon via characterization system of claim 12, further comprising an optical fiber that is transferring said laser light from said laser source to said beam collimator.

* * * * *